United States Patent
Weis

(10) Patent No.: US 6,694,494 B2
(45) Date of Patent: Feb. 17, 2004

(54) METHOD OF DESIGNING A MULTI-MODULE SINGLE-CHIP CIRCUIT SYSTEM

(75) Inventor: Eran Weis, Even Yehuda (IL)

(73) Assignee: Daro Semiconductors Ltd., Tel Aviv (IL)

(*) Notice: Subject to any disclaimer, the term of this patent is extended or adjusted under 35 U.S.C. 154(b) by 104 days.

(21) Appl. No.: 10/096,898

(22) Filed: Mar. 14, 2002

(65) Prior Publication Data

US 2002/0133786 A1 Sep. 19, 2002

Related U.S. Application Data

(60) Provisional application No. 60/276,143, filed on Mar. 16, 2001.

(51) Int. Cl.[7] ............................................. G06F 17/50
(52) U.S. Cl. ................................... 716/2; 716/1; 716/5
(58) Field of Search ............................... 716/1, 2, 3, 4, 716/5, 7, 12, 15, 16; 257/141, 139, 533, 728; 365/43, 63, 51, 52

(56) References Cited

U.S. PATENT DOCUMENTS 6,216,252 B1 * 4/2001 Dangelo et al. ............... 716/1
6,269,467 B1 * 7/2001 Chang et al. .................. 716/1
6,463,576 B1 * 10/2002 Tomoda ........................ 716/17
6,578,174 B2 * 6/2003 Zizzo ............................ 716/1
6,578,178 B2 * 6/2003 Mau .............................. 716/2

* cited by examiner

Primary Examiner—Vuthe Siek
Assistant Examiner—Binh Tat
(74) Attorney, Agent, or Firm—Mark M. Friedman

(57) ABSTRACT

A method of designing a single-chip circuit system that includes several dissimilar (digital, analog, memory, power, RF, electro-optical) modules, and the system so designed. A prior art method is used for an initial design of the system, including signal and power conductors connecting the modules. Signal conductors are initially designed for current densities in a first range. Power conductors are initially designed for current densities in a second range. For each signal conductor, an initial value of a design parameter is changed to increase the current density into a higher third range, the resistance of the conductor is reduced, and the parameter value is restored to its initial value. For each power conductor, an initial value of a design parameter is changed to decrease the current density into a lower fourth range, the resistance of the conductor is increased, and the parameter value is restored to its initial value.

23 Claims, 3 Drawing Sheets

METHOD OF DESIGNING A MULTI-MODULE SINGLE-CHIP CIRCUIT SYSTEM

This application claims the benefit of provisional No. 60/276,143 filed Mar. 16, 2001.

FIELD AND BACKGROUND OF THE INVENTION

The present invention relates to integrated circuit design and, more particularly, to an improved method of designing a single-chip integrated circuit that includes digital and/or analog and/or I/O and/or power and/or RF and/or electro-optical modules.

Methods of designing integrated chips that include only digital modules are well-known. See, for example, Dangelo et al., U.S. Pat. No. 6,216,252, which is incorporated by reference for all purposes as if fully set forth herein.

Methods of designing integrated chips that include both digital modules and analog, power, RF and/or electro-optical modules are less well established. The reason for this is historical. Although all electrical circuit designers once shared a common culture, this is no longer true.

The digital domain has taken the approach that a design engineer does not want to be bothered with the details. Current state of the art digital designers are really system-on-a chip designers, utilizing logic synthesis to create the desired systems. Little thought is given to how the library of logic blocks came to be or how many hours were spent characterizing the set-up and hold times. Digital designers just want the functionality to be exactly what is anticipated and for the timing to accurately reflect silicon.

Conversely, analog, power, RF and electro-optical engineers are from the old school: they don't trust what they didn't design themselves. Chances are that something in the specification has changed from the last time the module or function was used, and that change necessitates at least a review of the modules if not a complete re-design of the desired functions. Combining these two methodologies together to create a system-on-a-chip that includes digital, analog, power, RF and electro-optical functions is a complex task involving forethought and attention to detail.

One representative approach to the problem of combined digital-analog design can be found in Chang et al., U.S. Pat. No. 6,269,467, which is incorporated by reference for all purposes as if fully set forth herein.

One of the challenges in designing mixed-functionality integrated chips is that of preventing the signals in one type of block or module from interfering with the signals in another type of block or module. The three main mechanisms of unwanted interactions are through the substrate, through the power supplies and through the interconnects running between the various modules. In a typical design process, the modules are designed separately and then are laid out on the substrate. Then conductors for passing signals among the blocks are laid out either manually or using an automatic router. Guidelines are followed that allow as much isolation as possible between the various modules. An appropriate guardbar surrounding the analog-RF-electro-optical portion of the chip helps maintain the desired isolation.

Two general approaches are used in the layout of multi-signal circuits.

The first approach is to run separate power supplies to the different analog-RF-electro-optical and digital blocks. Ideally, the power supplies would come from separate power pins coming into the package with; separate traces running back to the power supply itself. If this is not possible, the next best option is to have separate supplies back to the power pad. This helps to isolate the noise coming through the metal power supply buses. This method of isolating power supplies is a general approach and is usually a good approach to multi-signal design regardless of what other methods are employed.

The second approach includes the separation of the power supplies and includes the isolation of the substrates to the extent possible. For example, in a standard CMOS process, the substrate is either bulk or epitaxial, and the isolation is most effectively done by guardbars and distance or proximity. A bulk substrate offers an advantage of additional resistance, acting as a filter to some of the high frequency noise that would otherwise affect surrounding circuitry. An epitaxial substrate is lower in resistance and therefore transmits noise signals more readily; but an epitaxial substrate offers better protection from latch up conditions and a slightly improved ESD (electrostatic discharge) protection over a bulk substrate.

The more area between the sensitive analog-RF-electro-optical portions of the circuit and the digital portions, the less interaction there is between the two groups. Guardbars are most effective next to the source of the noise and next to the circuitry being isolated. To further isolate the substrate, care must be taken to avoid injecting noise into the substrate. There are several mechanisms of noise injection. One way that noise is injected into the substrate is by overshooting the supply rails with input signals that are underdamped. These underdamped signals forward bias the PN junction diodes that make up the sources and drains of the transistors used in typical designs and inject current into the substrate. Overdamped signals may be just as damaging, not because of the substrate current and the associated noise, but because of the short circuit current and the associated noise on the power supply buses themselves. Often, separate supply buses are used to connect the substrate separately from the supplies carrying power to digital modules, to avoid the possibility of substrate noise being introduced by the relatively large noise spikes on the digital supplies.

In extreme cases, clock edges are slowed in order to reduce the noise introduced by the sudden transitions of the clock. Care must be taken in these cases to use modules that are accepting of slower clock edges and to make sure all the advantage gained by slower clock edges is not wasted because noise is introduced by the gates driven by the clock being in short circuit current mode for a longer period of time.

Outputs and inputs associated with the pads of the device also help in mixed signal design. Generally, a short, fat pad is preferred over the long, narrow pad associated with digital designs. This is generally true because few mixed signal circuits are pad limited. By having a shorter pad, the overall circuit size is smaller, which results in a cost savings. Most I/O pads for mixed signals now include multiple power supply buses that allow for multiple supply rails depending on the needs of the circuit. Often, the device is designed with a digital core and an analog-I/O ring. The digital core should be at a reduced voltage to help reduce power consumption, and the analog-I/O ring should be at a higher potential for interface and operational purposes. Often, an analog function is easier to realize with a higher supply voltage. As supply voltages decrease, some analog-RF-electro-optical techniques, such as cascaded devices, are not realizable.

Finally, as a mixed integrated circuit includes logic, memory, analog, electro-optical and RF modules, it must be possible to isolate any module for the purpose of testing. In other words, the inputs to the modules must be directly controllable from the chip inputs, and the outputs of the array must be directly observable at the chip output.

Although the prior art design methodology discussed above has been used successfully to integrate digital and analog modules on the same chip, the same can not be said for the integration of digital, RF and electro-optical modules on the same chip. This is particularly true with regard to chips implemented as silica-on-silicon, which is the most convenient technology for implementing electro-optical modules. There is thus a widely recognized need for, and it would be highly advantageous to have, a design method for a mixed-functionality integrated chip that allows the integration of digital, analog, RF and electro-optical modules on the same chip.

SUMMARY OF THE INVENTION

According to the present invention there is provided an improved method of designing a singe-chip circuit system that includes a first module and a second module dissimilar in type to the first module, each module being selected from the group consisting of digital modules, analog modules, I/O modules, power modules, RF modules and electro-optical modules, the improvement including the steps of: (a) providing an initial design of at least one electrical signal conductor for conducting electrical current having a current density in a first current density range between the first module and the second module; and (b) for each at least one electrical signal conductor: (i) changing a value of a parameter of the initial design from a first value to a second value to increase the current density to a second current density range higher than the first current density range, (ii) while keeping the parameter fixed: modifying the initial design to reduce an electrical resistance of the each electrical signal conductor, and (iii) restoring the parameter to the first value.

According to the present invention there is provided an improved method of designing a singe-chip circuit system that includes a first module and a second module dissimilar in type to the first module, each module being selected from the group consisting of digital modules, analog modules, I/O modules power modules, RF modules and electro-optical modules, the improvement including the steps of: (a) providing an initial design of at least one electrical power conductor for conducting electrical current having a current density in a first current range between the first module and the second module; and (b) for each at least one electrical power conductor: (i) changing a value of a parameter of the initial design from a first value to a second value to increase the current density to a second current density range lower than the first current density range, (ii) while keeping the parameter fixed: modifying the initial design to increase an electrical resistance of the each electrical power conductor, and (iii) restoring the parameter to the first value.

According to the present invention there is provided a single chip circuit system including: (a) a digital module; and (b) a RF module operationally connected to the digital module; both modules being fabricated on a single chip.

According to the present invention there is provided a single chip circuit system including: (a) a digital module; and (b) an electro-optical module, operationally connected to the digital module; both modules being fabricated on a single chip.

The terms "module" and "block" are used interchangeably herein. Among digital modules are included both logic modules and memory modules.

FIG. 1 is a schematic illustration of one kind of mixed-functionality integrated chip 10 whose design is improved by the method of the present invention. Chip 10 includes a digital module 12, an analog module 14, an RF module 16 and an electro-optical module 18. Around the periphery of chip 10 are several I/O modules 20. Modules 12, 14, 16, 18 and 20 exchange electrical signals via electrical signal conductors 22. Modules 12, 14, 16 and 18 also receive electrical power via electrical power conductors 24. More generally, the present invention is directed towards the design of a chip with at least two different modules of two different types. For example, if the first module is a digital module, then the second module may be an analog module, an I/O module, a power module, an RF module or an electro-optical module. Similarly, if the first module is an analog module, then the second module may be a digital module, an I/O module, a power module, an RF module or an electro-optical module; if the first module is an I/O module, then the second module may be a digital module, an analog module, a power module, an RF module or an electro-optical module; if the first module is a power module, then the second module may be a digital module, an analog module, an I/O module, an RF module or an electro-optical module; if the first module is an RF module, then the second module may be a digital module, an analog module, an I/O module, a power module or an electro-optical module; and if the first module is an electro-optical module, then the second module may be a digital module, an analog module, an I/O module, a power module or an RF module. The present invention is directed towards optimizing the design of conductors 22 and 24. Specifically, given initial designs of conductors 22 and 24 according to a prior art method, the present invention is used to adjust the design of conductors 22 and 24 to further reduce mutual interference among modules 12, 14, 16 and 18.

One of the parameters used by the prior art method to obtain the initial design is the current density to be carried by signal conductors 22. According to the present invention, this current density is selected to be in a first range, preferably from about $10^5$ amp/cm$^2$ to about $10^6$ amp/cm$^2$. Then the value of one of the design parameters of each signal conductor 22 is changed in a manner that increases the current density to fall within a higher second range, preferably from about $5 \times 10^5$ amp/cm$^2$ to about $5 \times 10^7$ amp/cm$^2$. Note that "higher" in this context means that the low end of the second range is higher than the low end of the first range and that the high end of the second range is higher than the high end of the first range. In other words, the two ranges may overlap. It is not necessary for the low end of the second range to be higher than the high end of the first range. Preferably, the design parameters whose values are changed are the widths of signal conductors 22. These widths are decreased to move the current densities carried by signal conductors 22 into, or deeper into, the desired second range. The initial design then is modified, while keeping the changed values of the design parameters fixed, to reduce the electrical resistances of signal conductors 22, preferably by between about 5% and about 10%. Preferably, the modification is effected by shortening signal conductors 22 and/or by changing the curvatures of portions of signal conductors 22. Finally, the changed values of the design parameters are restored to their values in the initial design.

Similarly, another of the parameters used by the prior art method to obtain the initial design is the current density to be carried by power conductors 24. According to the present invention, this current density is selected to be in a first range, preferably from about 1000 amp/cm$^2$ to about $10^7$ amp/cm$^2$. Then the value of one of the design parameters of each power conductor 24 is changed in a manner that decreases the current density to fall within a lower second range, preferably from about 100 amp/cm$^2$ to about $10^6$ amp/cm$^2$. Note that "lower" in this context means that the high end of the second range is lower than the high end of the first range and that the low end of the second range is lower than the low end of the first range. In other words, the two ranges may overlap. It is not necessary for the high end of the second range to be lower than the low end of the first range. Preferably, the design parameters whose values are changed are the widths of power conductors 24. These widths are increased to move the current densities carried by power conductors 24 into, or deeper into, the desired second range. The initial design then is modified, while keeping the changed values of the design parameters fixed, to increase the electrical resistance of power conductors 24, preferably by between about 5% and about 10%. Preferably, the modification is effected by lengthening power conductors 24 and/or by changing the curvatures of portions of power conductors 24. Finally, the changed values of the design parameters are restored to their values in the initial design.

Preferably, following the revisions of signal conductors 22 and power conductors 24 in accordance with the present invention, the overall design of the chip is back-annotated.

The scope of the present invention also includes a single-chip circuit system designed using the methods of the present invention. In addition, the scope of the present invention also includes a single-chip circuit system that has both a digital module and an RF module on the same chip, as well as a single-chip circuit system that has both a digital module and an electro-optical module on the same chip. To the best of our knowledge, it has not been possible heretofore to fabricate either a chip that includes both a digital module and an RF module or a chip that includes both a digital module and an electro-optical module, with acceptably low levels of mutual interference between the modules. Preferably, the modules are fabricated using silica-on-silicon technology, which, as noted above, is the most convenient technology for fabricating electro-optical chips. Preferably, the chips also include analog modules, operationally connected to one or both of the other modules on the chips.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
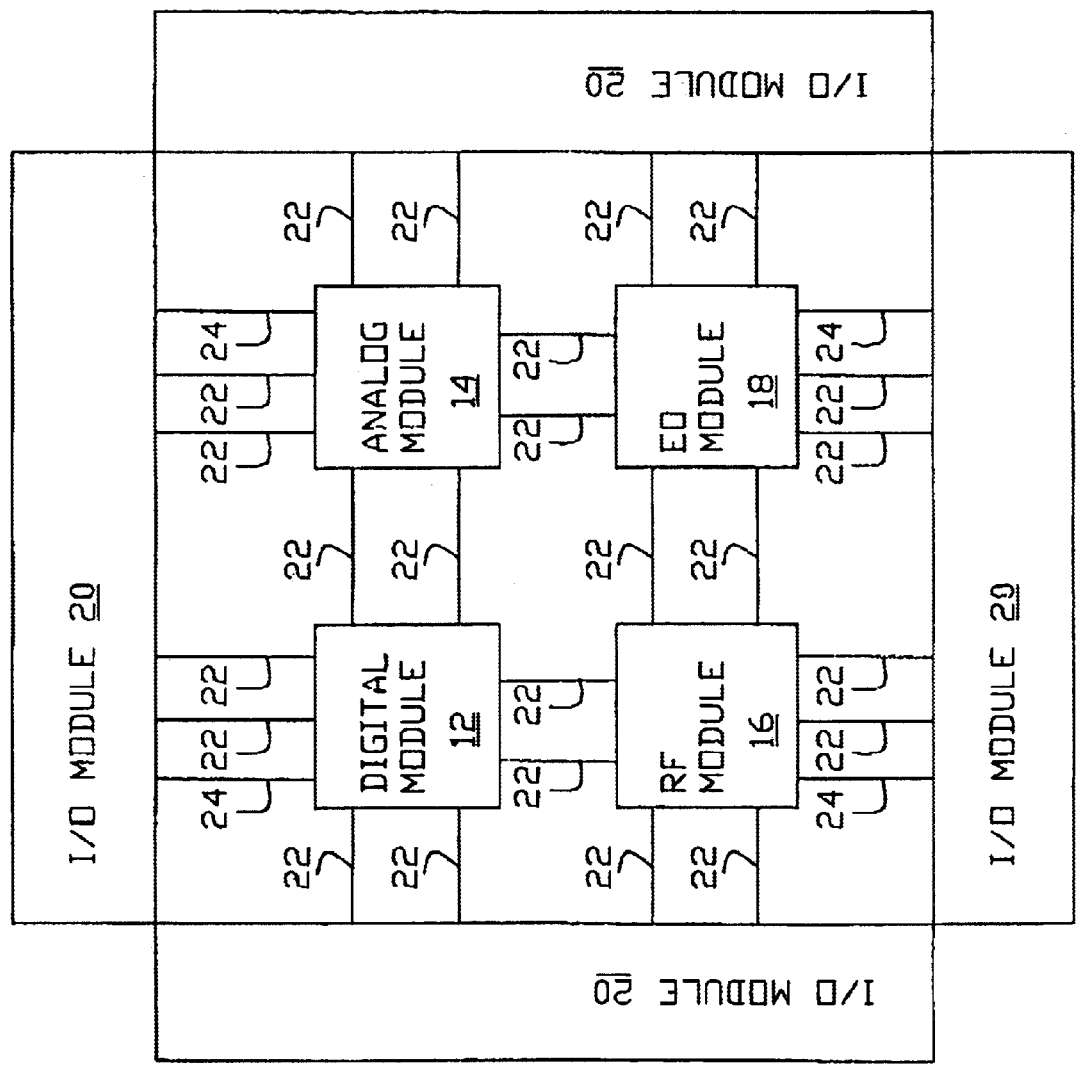
FIG. 1 is a schematic illustration of a typical mixed-functionality integrated chip.

The present invention is of an improved method of designing a single-chip integrated circuit that includes modules of dissimilar types. Specifically, the present invention can be used to minimize mutual interference of the modules.

The principles and operation of integrated circuit design according to the present invention may be better understood with reference to the drawings and the accompanying description.

The discussion that follows continues to refer to chip 10 as a mixed-functionality integrated chip that is designed by the method of the present invention. It is to be understood that this is merely and example of the application of the present invention to chip design, and that the present invention can be used in designing any integrated chip that includes a mixture of digital and/or analog and/or I/O and/or power and/or RF and/or electro-optical modules.

Modules 12, 14, 16, 18 and 20 are designed separately as taught in the prior art, for example by the methodology of Chang et al. The locations of modules 12, 14, 16, 18 and 20 within chip 10 are selected, and conductors 22 and 24 are laid out, with the prior art techniques discussed above being used to isolate modules 12, 14, 16 and 18 from each other. For example, the portion of the chip that includes modules 14, 16 and 18 is surrounded with an appropriate guardbar. Signal conductors 22 are designed to carry electrical currents having current densities in the range of $10^5$ amp/cm$^2$ to $10^6$ amp/cm$^2$. Power conductors 24 are designed to carry electrical currents having current densities in the range of 1000 amp/cm$^2$ to $10^7$ amp/cm$^2$.

It is at this point in the design of chip 10 that the methods of the present invention come into play.

Figure 2:
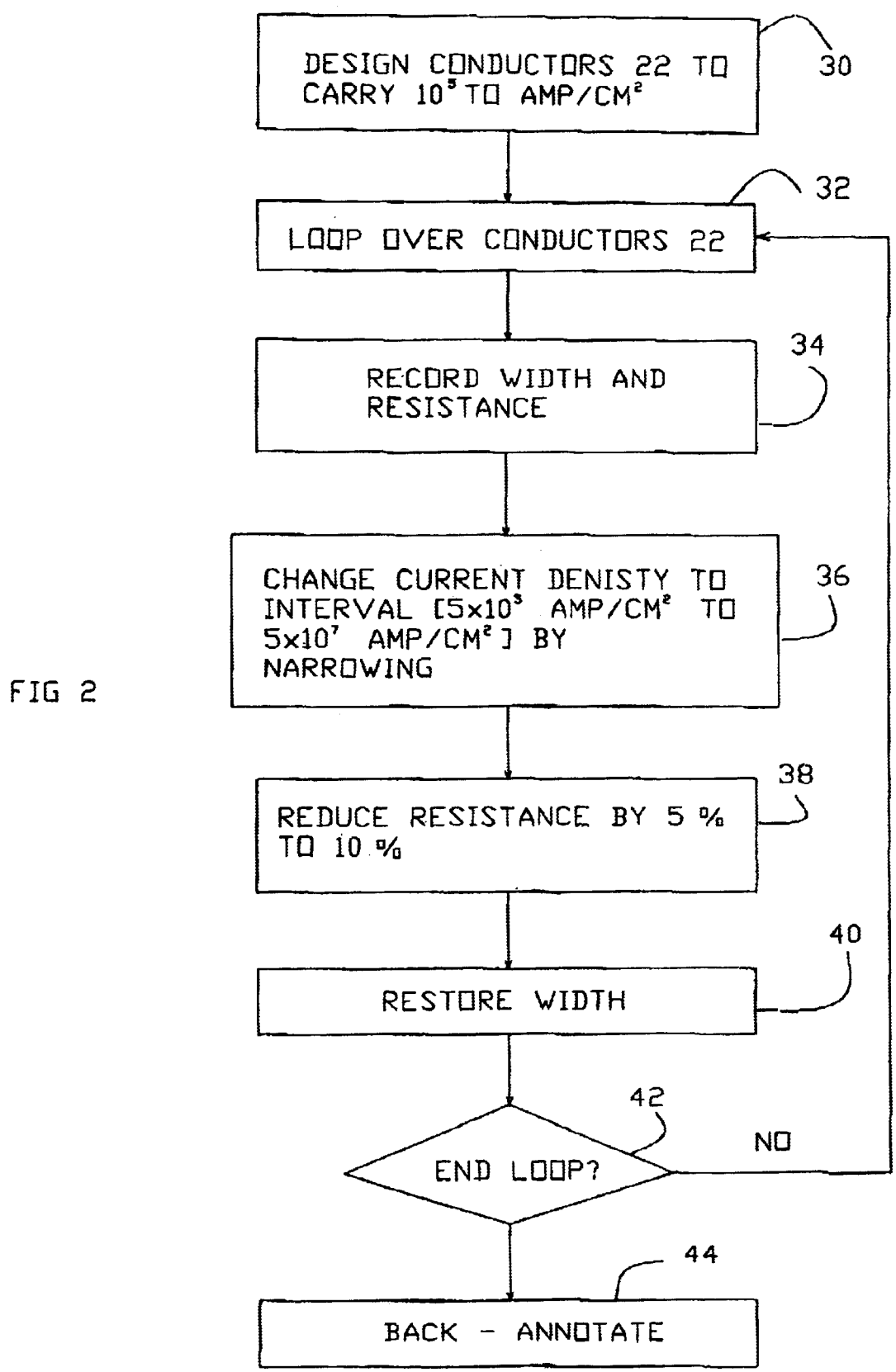
FIG. 2 is a flow chart of the method for adjusting electrical signal conductors.

Referring again to the drawings, FIG. 2 is a flow chart of the method of the present invention for adjusting the initial design of signal conductors 22. Block 30 actually refers to the design of signal conductors 22 by a prior art method to carry electrical currents having current densities in the range of $10^5$ amp/cm$^2$ to $10^6$ amp/cm$^2$, as discussed above. The method of the present invention per se starts in block 32 as a loop over signal conductors 22. For each signal conductor 22, the width and the electrical resistance of the targeted signal conductor 22, as initially designed, are recorded in block 34. In block 36, the targeted signal conductor 22 is made narrower to put the current density carried by the targeted signal conductor 22 into the range [$5\times10^5$ amp/cm$^2$, $5\times10^7$ amp/cm$^2$]. In block 38, the overall electrical resistance of the targeted signal conductor 22 is reduced from the value recorded in block 34 by between 5% and 10%, for example by shortening the target signal conductor 22 or by changing the curvature of a portion of the targeted signal conductor 22. In block 40, the width of the targeted signal conductor 22 is restored to its initial design value as recorded in block 34.

In block 42, a determination is made of whether all signal conductors 22 have been adjusted. If any signal conductors 22 remain to be adjusted, the method returns to block 32. Otherwise, in block 44, the overall design of chip 10 is back-annotated. "Back-annotation" refers to the updating of an earlier, typically more abstract design of an integrated circuit chip, on the basis of information from later design stages.

Figure 3:
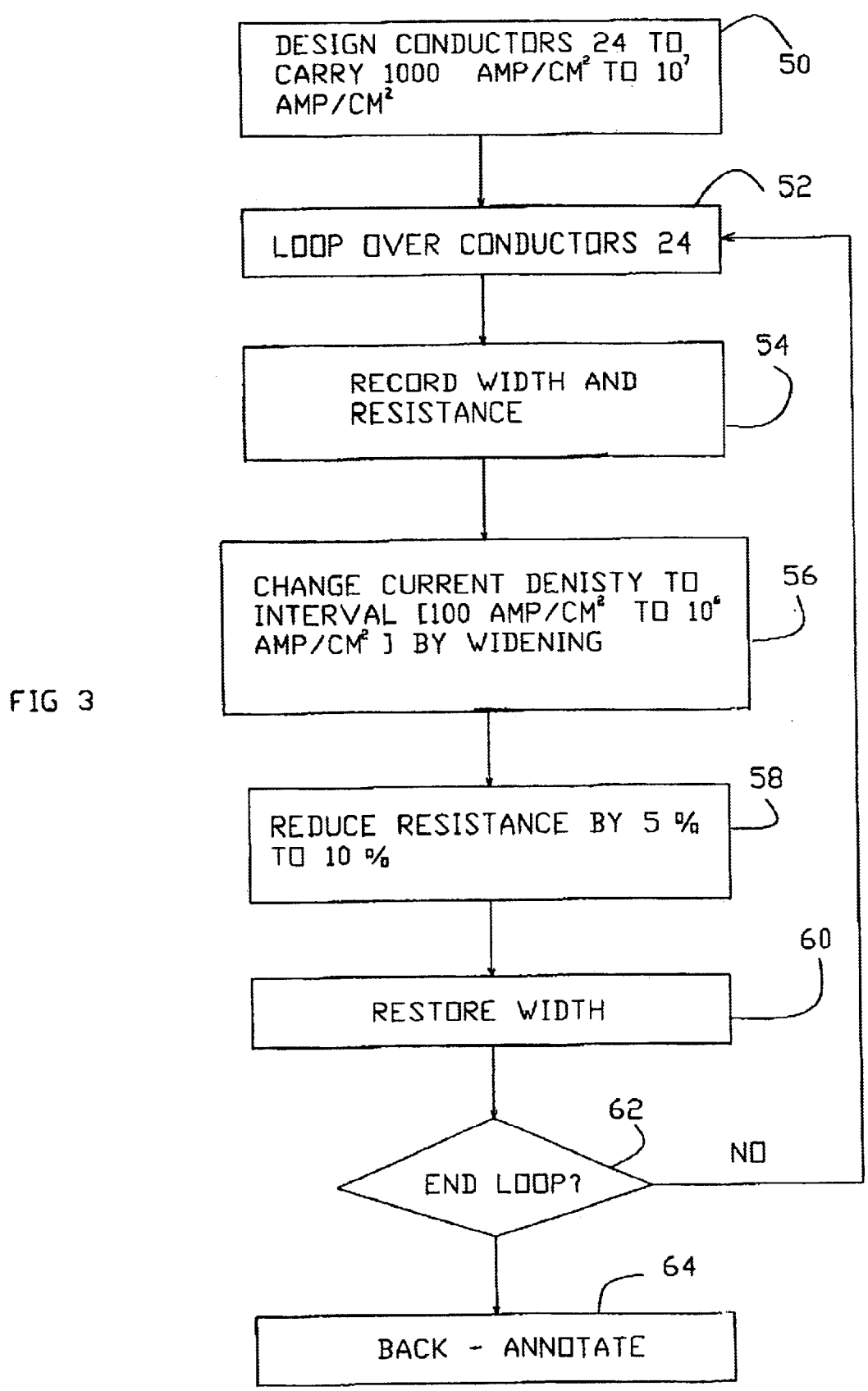
FIG. 3 is a flow chart of the method for adjusting electrical power conductors.

The initial design of power conductors 24 is adjusted similarly. FIG. 3 is a flow chart of the method of the present invention for adjusting the initial design of power conductors 24. Block 50 actually refers to the design of power conductors 24 by a prior art method to carry electrical currents having current densities in the range of 1000 amp/cm$^2$ to $10^7$ amp/cm$^2$, as discussed above. The method of the present invention per se starts in block 52 as a loop over power conductors 24. For each power conductor 24, the width and the electrical resistance of the targeted power conductor 24, as initially designed, are recorded in block 54. In block 56, the targeted power conductor 24 is made wider to put the current density carried by the targeted power conductor 24 into the range 100 amp/cm$^2$, $10^6$ amp/cm$^2$]. In block 58, the overall electrical resistance of the targeted power conductor 24 is increased from the value recorded in block 54 by between 5% and 10%, for example by lengthening the target power conductor 24 or by changing the curvature of a portion of the targeted power conductor 24. In block 60, the width of the targeted power conductor 24 is restored to its initial design value as recorded in block 54.

In block 62, a determination is made of whether all power conductors 24 have been adjusted. If any power conductors 24 remain to be adjusted, the method returns to block 52. Otherwise, in block 64, the overall design of chip 10 is back-annotated.

While the invention has been described with respect to a limited number of embodiments, it will be appreciated that many variations, modifications and other applications of the invention may be made.

What is claimed is:

1. An improved method of designing a single-chip circuit system that includes a first module and a second module dissimilar in type to the first module, each module being selected from the group consisting of digital modules, analog modules, I/O modules, power modules, RF modules and electro-optical modules, the improvement comprising the steps of:
(a) providing an initial design of at least one electrical signal conductor for conducting electrical current having a current density in a first current density range between the first module and the second module; and
(b) for each said at least one electrical signal conductor:
   (i) changing a value of a parameter of said initial design from a first value to a second value to increase said current density to a second current density range higher than said first current density range,
   (ii) while keeping said parameter fixed: modifying said initial design to reduce an electrical resistance of said each electrical signal conductor, and
   (iii) restoring said parameter to said first value.

2. The method of claim 1, wherein said first current density range is from about $10^5$ amp/cm$^2$ and about $10^6$ amp/cm$^2$, and wherein said second current density range is from about $5 \times 10^5$ amp/cm$^2$ and about $5 \times 10^7$ amp/cm$^2$.

3. The method of claim 1, wherein, for each said at least one electrical signal conductor, said parameter is a width of said each electrical signal conductor, said changing being a decreasing of said width.

4. The method of claim 1, wherein, for each said at least one electrical signal conductor, said modifying reduces said electrical resistance by between about 5% and about 10%.

5. The method of claim 1, wherein, for each said at least one electrical conductor, said modifying is effected by shortening said each conductor.

6. The method of claim 1, wherein, for each said at least one electrical conductor, said modifying is effected by changing a curvature of at least a portion of said each conductor.

7. The method of claim 1, further comprising the step of:
(c) back-annotating an overall design of the single-chip circuit system, based on all said at least one changed, modified and restored electrical signal conductor.

8. The method of claim 1, further comprising the steps of:
(c) providing an initial design of at least one electrical power conductor for conducting electrical current having a current density in a third current range between the first module and the second module; and
(d) for each said at least one electrical power conductor:
   (i) changing a value of a parameter of said initial design from a first value to a second value to increase said current density to a fourth current density range lower than said third current density range,
   (ii) while keeping said parameter fixed: modifying said initial design to increase an electrical resistance of said each electrical power conductor, and
   (iii) restoring said parameter to said first value.

9. The method of claim 8, wherein said third current density range is from about 1000 amp/cm$^2$ to about $10^7$ amp/cm$^2$, and wherein said fourth current density range is from about 100 amp/cm$^2$ to about $10^6$ amp/cm$^2$.

10. The method of claim 8, wherein, for each said at least one electrical power conductor, said parameter is a width of said each electrical power conductor, said changing being an increasing of said width.

11. The method of claim 8, wherein, for each said at least one electrical power conductor, said modifying increases said electrical resistance by between about 5% and about 10%.

12. The method of claim 8, wherein, for each said at least one electrical power conductor, said modifying is effected by lengthening said each conductor.

13. The method of claim 8, wherein, for each said at least one electrical power conductor, said modifying is effected by changing a curvature of at least a portion of said each conductor.

14. The method of claim 1, further comprising the step of:
(e) back-annotating an overall design of the single-chip circuit system, based on all said at least one changed, modified and restored electrical power conductor.

15. A single-chip circuit system designed using the method of claim 1.

16. An improved method of designing a single-chip circuit system that includes a first module and a second module dissimilar in type to the first module, each module being selected from the group consisting of digital modules, analog modules, I/O modules power modules, RF modules and electro-optical modules, the improvement comprising the steps of:
(a) providing an initial design of at least one electrical power conductor for conducting electrical current having a current density in a first current range between the first module and the second module; and
(b) for each said at least one electrical power conductor:
   (i) changing a value of a parameter of said initial design from a first value to a second value to increase said current density to a second current density range lower than said first current density range,
   (ii) while keeping said parameter fixed: modifying said initial design to increase an electrical resistance of said each electrical power conductor, and
   (iii) restoring said parameter to said first value.

17. The method of claim 16, wherein said first current density range is from about 1000 amp/cm2 to about $10^7$ amp/cm$^2$, and wherein said second current density range is from about 100 amp/cm$^2$ to about $10^6$ amp/cm$^2$.

18. The method of claim 16, wherein, for each said at least one electrical power conductor, said parameter is a width of said each electrical power conductor, said changing being an increasing of said width.

19. The method of claim 16, wherein, for each said at least one electrical power conductor, said modifying increases said electrical resistance by between about 5% and about 10%.

20. The method of claim 16, wherein, for each said at least one electrical power conductor, said modifying is effected by lengthening said each conductor.

21. The method of claim 16, wherein, for each said at least one electrical power conductor, said modifying is effected by changing a curvature of at least a portion of said each conductor.

22. The method of claim 16, further comprising the step of:
(c) back-annotating an overall design of the single-chip circuit system, based on all said at least one changed, modified and restored electrical power conductor.

23. A single-chip circuit system designed using the method of claim 16.

* * * * *